(12) United States Patent
Bogner (10) Patent No.: US 11,700,006 B2
(45) Date of Patent: Jul. 11, 2023

(54) PASSIVE SAMPLE-AND-HOLD ANALOG-TO-DIGITAL CONVERTER WITH SPLIT REFERENCE VOLTAGE

(71) Applicant: Infineon Technologies AG, Neubiberg (DE)

(72) Inventor: Peter Bogner, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/514,432

(22) Filed: Oct. 29, 2021

(65) Prior Publication Data

US 2023/0137067 A1 May 4, 2023

(51) Int. Cl.
*H03M 1/10* (2006.01)
*H03M 1/12* (2006.01)
*H03M 1/14* (2006.01)
*H03M 1/46* (2006.01)

(52) U.S. Cl.
CPC ............ *H03M 1/1009* (2013.01); *H03M 1/12* (2013.01); *H03M 1/124* (2013.01); *H03M 1/145* (2013.01); *H03M 1/466* (2013.01)

(58) Field of Classification Search
CPC ...... H03M 1/1009; H03M 1/12; H03M 1/145; H03M 1/124; H03M 1/466
See application file for complete search history.

(56) References Cited

U.S. PATENT DOCUMENTS

| | | |
|---|---|---|
| 2011/0254569 A1 | 10/2011 | Bogner et al. |
| 2013/0002469 A1* | 1/2013 | Kull ..................... H03M 1/0682 341/172 |
| 2014/0002286 A1 | 1/2014 | Bogner et al. |
| 2018/0143658 A1* | 5/2018 | McCarthy ................. G05F 3/30 |

\* cited by examiner

*Primary Examiner* — Joseph J Lauture
(74) *Attorney, Agent, or Firm* — Murphy, Bilak & Homiller, PLLC (57) ABSTRACT

An analog-to-digital converter (ADC) circuit comprises one or more most-significant-bit (MSB) capacitors having first ends connected to a voltage comparator and one or more least-significant-bit (LSB) capacitors having first ends connected to the comparator. The circuit further comprises a first switching circuit for each MSB capacitor, configured to selectively connect the second end of the respective MSB capacitor to (a) an input voltage, for sampling, (b) a ground reference, during portions of a conversion phase, and (c) a first conversion reference voltage, for other portions of the conversion phase. The circuit still further comprises a second switch circuit, for each LSB capacitor, configured to selectively connect the second end of the respective LSB capacitor between (d) the ground reference, during portions of the conversion phase, and (e) a second conversion reference voltage, for other portions of the conversion phase, the second conversion reference voltage differing from the first.

20 Claims, 6 Drawing Sheets

PASSIVE SAMPLE-AND-HOLD ANALOG-TO-DIGITAL CONVERTER WITH SPLIT REFERENCE VOLTAGE

TECHNICAL FIELD

The present disclosure is generally directed to analog-to-digital converters (ADCs), and more particularly to successive-approximation ADCs.

BACKGROUND

Many applications where analog signals are converted to digital signals require that the analog-to-digital conversion be performed with a very low noise figure, as well as with a high conversion speed. A low noise figure is normally achieved by using a voltage reference that is external to the integrated circuit that carries the ADC, with decoupling capacitors that are too large (e.g., >10 nF) to be easily integrated into the chip with the rest of the ADC circuit. This external reference is connected to the ADC circuit via a bond wire to the internal ADC core and thus the ADC circuit may be limited in its operation speed due to the bond wire inductance.

Very often, an external reference is defined as 'high' voltage, with respect to the voltages used to run the core of the integrated circuit. A particular example is microcontroller applications, where a 5V reference might be used for analog sensors and the ADC, allowing a ratiometric measurement using the shared reference. The transistors used for the digital circuitry onboard the integrated circuit might typically be operated at about 1V. Having a 5V reference requires the usage of 5V transistors, but these transistors are much slower compared to the digital 1V transistors.

In this scenario, defining a 1V internal reference for use by the ADC requires a reference buffer and allows an ADC core with fast transistors. But, this introduces additional power consumption and noise contribution. The achievable noise figure is defined by the maximum power consumption of the buffer. Thus, a desired combination of a fast ADC with radiometric measurements and low noise figures is limited by performance of the 5V transistor and package parasitics.

In many microcontroller chips, there is a need for analog sensor measurements. This requires typically several analog inputs processed by an ADC. A very stringent requirement on many such chips is the exact identical sample time point for several input channels. This is especially the case in motor control where three phases need to be measured at same time point. The conversion of the time-correct samples can be executed in a sequence. This problem can be addressed by using a passive sample-and-hold ADC, as described in U.S. Patent Application Publication No. US 2014/0002286 A1, the entire contents of which are incorporated herein by reference, to provide background and context for the techniques and circuits described herein. The architecture described in US 2014/0002286 A1 provides major area and performance benefits compared to other solutions, such as the use of multiple instances of a stand-alone ADC.

Increasing the speed of an ADC is normally addressed by implementing the ADC core with digital transistors. This allows a major speed improvement, but at the cost of increased noise figure. Oversampling can be used to improve noise figure. But, this requires more samples for a channel measurement, and thus makes it difficult to perform extensive input channel multiplexing. Digital filtering is also used for noise suppression, but requires additional complexity and area. Additional improvements are necessary.

SUMMARY

The circuits described herein use both an external and internal reference, to exploit the speed of the low-voltage reference for lower-bit conversion while exploiting the low noise figure from the external reference for higher-bit conversion. The techniques and circuits described herein can be used to improve the speed of ADCs, while also reducing the circuit size. These techniques may be used to improve the noise-versus-speed performance of a single ADC, as well as to improve the performance of a passive sample-and-hold ADC, e.g., as described in US 2014/0002286 A1.

An example embodiment of the circuits described herein is a successive-approximation analog-to-digital converter (ADC) circuit that comprises a voltage comparator, one or more most-significant-bit (MSB) capacitors, with each having a first end connected to an input of the comparator, and one or more least-significant-bit (LSB) capacitors, again with each having a first end connected to the input of the comparator. This example embodiment further comprises one or more first switch devices corresponding to each MSB capacitor and configured to selectively connect the second end of the respective MSB capacitor to (a) an input voltage, for the duration of a sampling phase, (b) a ground reference, during portions of a conversion phase, and (c) a first conversion reference voltage for other portions of the conversion phase. The example embodiment further comprises one or more second switch devices corresponding to each LSB capacitor and configured to selectively connect the second end of the respective LSB capacitor between (d) the ground reference, during portions of the conversion phase, and (e) a second conversion reference voltage, for other portions of the conversion phase, where the second conversion reference voltage differs from the first conversion reference voltage.

As will be discussed in further detail below, the use of different reference voltages for the MSB capacitors and LSB capacitors of the DAC array of the ADC circuit allows the LSB capacitors and their associated circuitry, which may be internal to an integrated circuit, to be designed for lower voltages than the MSB capacitors and their associated circuitry, which may be external to an integrated circuit. This provides for several advantages with respect to the trade-off between operating speed and noise, as well as with respect to circuit size.

Several variations of the circuit summarized above are described below and illustrated in the accompanying figures, as are additional advantages to various implementations.

BRIEF DESCRIPTION OF THE FIGURES

The detailed description below is set forth with reference to the accompanying figures. In the figures, the use of the same reference numbers in different figures indicates similar or identical items.

The devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

In the following, some embodiments of the present invention will be described in detail. It is to be understood that the following description is given only for the purpose of illustration and is not to be taken in a limiting sense. The scope of the invention is not intended to be limited by the embodiments described hereinafter with reference to the accompanying drawings, but is intended to be limited only by the appended claims and equivalents thereof.

It is also to be understood that in the following description of the embodiments, unless the context or description indicates otherwise, any direct connection or coupling between functional blocks, devices, components, circuit elements or other physical or functional units shown in the drawings or described herein could also be implemented by an indirect connection or coupling, i.e., a connection or coupling comprising one or more intervening elements. Furthermore, it should be appreciated that functional blocks or units shown in the drawings may be implemented as separate circuits in some embodiments, but may also be fully or partially implemented in a common circuit in other embodiments. On the other hand, a single functional block may also be implemented using a plurality of separate circuits.

It should be noted that the drawings are provided to give an illustration of some aspects of embodiments of the present invention and are therefore to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative location of the various components and implementations according to an embodiment of the invention.

The features of the various embodiments described herein may be combined with each other unless specifically noted otherwise. On the other hand, describing an embodiment with a plurality of features is not to be construed as indicating that all those features are necessary for practicing the present invention, as other embodiments may comprise less features and/or alternative features.

Some of the embodiments relate to measurement apparatuses and devices. Measurement in the context of this application is intended to be understood as any capturing of a physical quantity, for example a current or a voltage, and converting the captured quantity to a signal, for example a digital signal, which may then be further processed.

The description of various techniques and circuits herein focuses on binary-weighted successive-approximation register (SAR) ADCs, but the techniques can be applied to different architectures, including, for example, redundant-coded SAR and tracking ADCs. It will be appreciated that redundant-coded ADCs provide particular advantages, which will be described below. Also, the description herein is based on single-ended ADCs, i.e., ADCs with one signal input, referenced to ground or some other fixed voltage reference. However, the techniques and circuits described herein can readily be extended to differential ADCs, i.e., ADCs having two inputs and that convert the differential signal between these inputs into digital form, where these differential ADCs use differential voltage references.

Figure 1:
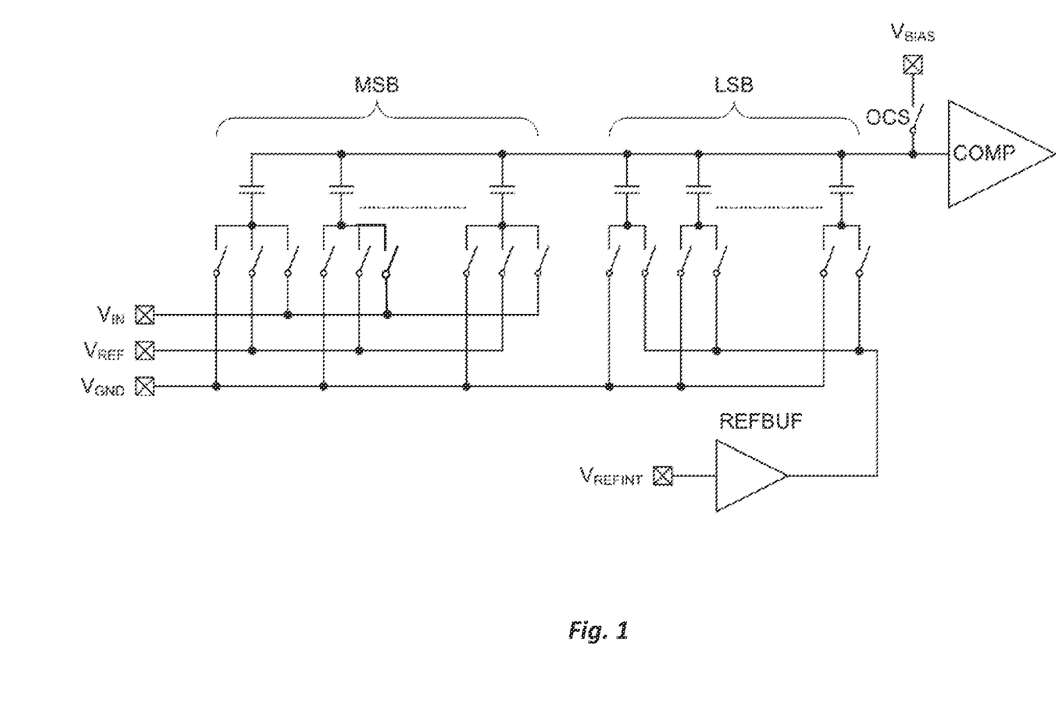
FIG. 1 illustrates the concept of the split-reference SAR ADC.

The inventive techniques and circuits described herein use a combination of an external reference and an internal reference, in the DAC portion of an SAR ADC circuit, in what might be called a "split-reference" ADC. The speed of the low-voltage reference is exploited for the lower-bit conversion, while the low noise figure from the external reference is exploited for the higher-bit conversion. FIG. 1 illustrates the concept. The most-significant-bit (MSB) capacitors are used for sampling and conversion. In sampling mode, the offset-compensation switch (OCS) is closed, together with the switches connecting the MSB capacitors to $V_{IN}$. During this sampling phase, the LSB capacitors may also be connected to $V_{IN}$, but might instead be connected to ground ($V_{GND}$). With the latter approach, the LSB capacitors are not used for sampling, avoiding the need for high-voltage robustness and enabling the usage of fast thin oxide transistors for all LSB capacitors. The switches located at the MSB capacitors, on the other hand, need to be "high-voltage" robust allowing an external reference and an input voltage in the same voltage class as the external reference. This requirement is necessary to support ratiometric measurements.

Note that the terms "high-voltage" and "low-voltage" as used herein should be understood in a context-specific way. "High-voltage" refers to voltages on a similar scale to the highest of the maximum voltage being sample and the external reference voltage. "Low-voltage" refers to voltages on a similar scale to the lowest voltages used to power digital circuit components of the ADC circuit.

Referring again to FIG. 1, during the conversion phase, following the sampling phase, the OCS switch is open and the MSB capacitors are successively connected to $V_{REF}$ or $V_{GND}$ according to the SAR algorithm. Once the SAR search algorithms is completed for the MSB capacitors, the SAR algorithm will continue the search with the LSB capacitors, connecting them to $V_{GND}$ or the internal reference derived from $V_{REFINT}$ by the reference buffer REFBUF.

Due to the usage of different references, the time allowed for settling the DAC can be different between the MSB and the LSB search. In embodiments that fully exploit the advantages of the technique to improve the noise-versus-speed tradeoff, the MSB search will typically be slower than the LSB search, on a bit-by-bit basis.

As seen in FIG. 1, in SAR ADCs the DAC capacitor is typically built as an array of capacitors, based on decreasing binary-weighted capacitances. If the same reference voltage were to be used for all the capacitors, as is the case with a conventional switched-charged DAC, the MSB capacitor of the DAC would have a capacitance equal to, or approximately equal to, 50% of the total capacitance C of the entire capacitor Array. The capacitor corresponding to MSB-1 would have a capacitance equal to, or approximately equal to, 25% of the total array capacitance, and so on. For a 10-bit ADC having 10 DAC capacitors (plus, in some embodiments, an extra LSB capacitor having the same capacitance as the lowest of the 10 DAC capacitors, so that the binary weighting works properly), for example, the four capacitors for the four most significant bits will have capacitances equal to 50%, 25%, 12.5%, and 6.25% of the total capacitance and will thus sum to 93.5% of the total capacitance, while the 6 remaining DAC LSB capacitors will sum to only 6.15234375% of the total capacitance (3.125%+1.5625%+0.78125%+0.390625%+0.1953125%+0.09765625%).

This ratio is also responsible for the ratio of noise contribution. The external reference can be very low noise, due to the availability of large external decoupling capacitors. The internal reference, on the other hand, is typically a relatively high source of noise, due both to the generation of the reference and the necessary buffer to drive the switched capacitor load. In the 10-bit ADC example discussed above, the internal reference will contribute with a weight of about 6.25% to the final noise figure, while the external reference will contribute with a weight of 93.5%. This results in a noise figure dominated by the relatively low-noise external reference.

However, when different reference voltages are used for the external and internal references, the MSB capacitor values must also be scaled, relative to the LSB capacitors, in the example circuit of FIG. 1. The reference voltages themselves might be chosen to be any values, to fit technology limitations. As an example, an internal reference of 1V and an external reference of 5V can be chosen, for a given application. This would result in a ratio of 1/5, which should be applied to the MSB capacitor sizes. This means that the capacitance for each of the capacitors coupled to the external reference should be 1/5 what it would be in a state-of-the-art standard SAR using only a single voltage reference for all of the capacitors. Thus, if C is the total capacitance of the capacitor array for a 10-bit successive approximation ADC, for example, the capacitances for an array where all of the capacitors are coupled to the same voltage reference would be:

{C/2, C/4, C/8, C/16, C/32, C/64, C/128, C/256, C/512, C1024}.

When some of the capacitors are coupled to a higher voltage external reference, however, those capacitance values are scaled according to the ratio of the internal reference voltage to the external reference voltage. Thus, for example, if the capacitors for the 4 most-significant bits of the 10-bit ADC are coupled to the external reference voltage, the capacitances for the array would be:

{kC/2, kC/4, kC/8, kC/16, C/32, C/64, C/128, C/256, C/512, C1024}, where k is the ratio of the internal reference voltage to the external reference voltage, $V_{REFINT}/V_{REF}$. Typically, this will be less than 1, as in the example discussed above for a 1V internal reference voltage and a 5V external reference voltage, so the capacitances of the capacitors coupled to the external reference voltage will be scaled down, relative to the values they would have if the entire binary-weighted array of capacitances were coupled to a single reference voltage.

Note that compared to the example discussed above, the calculated noise contributions for the split-reference case will be different, compared to the case where the same reference voltage applies to the entire capacitor array, and the noise figure will be larger, since the scaled-down MSB capacitors will contribute a smaller share of the total noise contribution, but the resulting circuit will still show a much smaller noise contribution from the LSB capacitors, relative to the MSB capacitors.

The ratio between the internal and external reference should be accurate, because the ratio must match the scaling ratio for the capacitors. A mismatch between the implemented capacitor scaling ratio and the external-to-internal reference voltage ratio will result in a linearity error of the ADC. For high-resolution ADCs, this means that calibration may be necessary. Calibration is state of the art for high-resolution ADCs and will also correct linearity error contributions coming from the split-reference concept described here.

One benefit of the split-reference architecture, in many embodiments, is reduced circuit area. Switches implemented in the high-voltage part of the ADC require level shifters. The level shifters and the switches themselves in the domain of the external reference are larger than switches implemented with thin-gate oxide transistors, for example, in the internal reference domain. In the 10-bit example discussed above, 60% of the switches are moved from the 5V domain to the 1V domain, resulting in an area reduction in the range of 40%, including level shifters. This is significant, because n nanometer-scale technologies the 5V level shifters and switches can occupy a major part of the entire ADC circuit.

Figure 2:
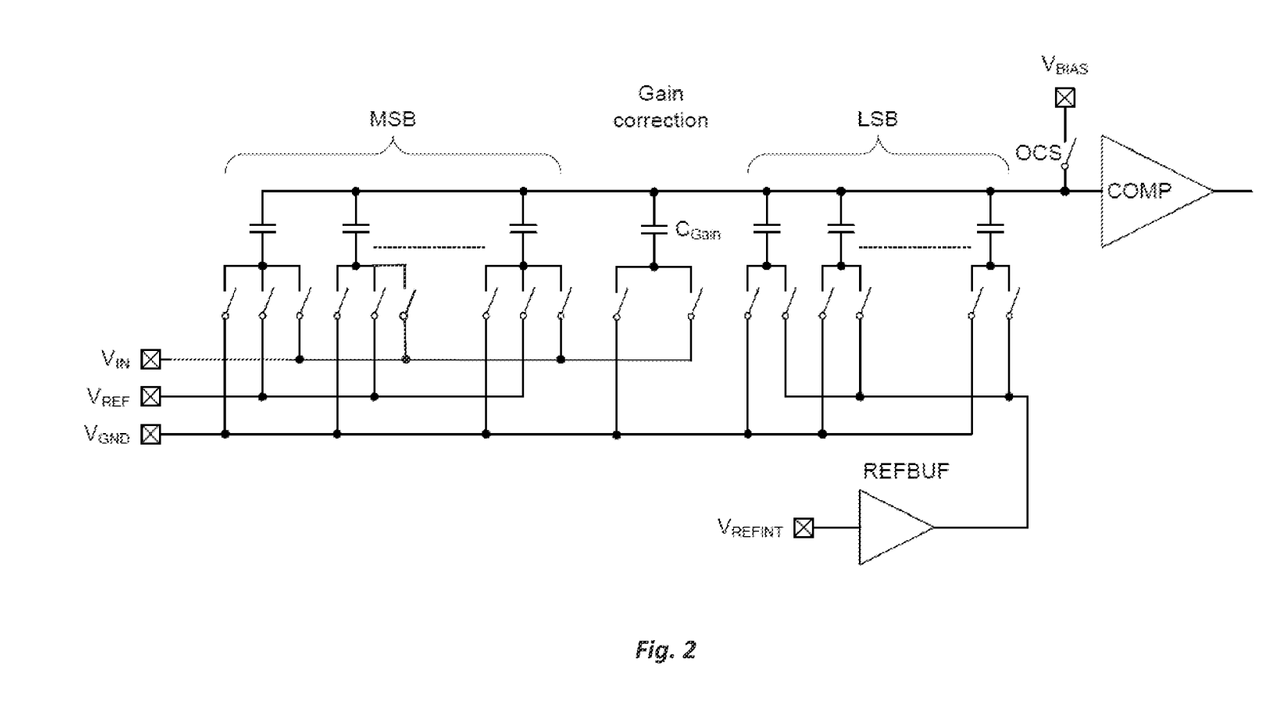
FIG. 2 illustrates a variation of the circuit shown in FIG. 1, including a gain correction capacitor.

The architecture of FIG. 1 implements a gain error. Because the LSB capacitors are not connected to $V_{IN}$ during the sampling phase, the full-scale voltage of the DAC portion of the SAR is not identical to the external reference voltage. This can be compensated by adding an additional capacitor for gain compensation. This is shown in FIG. 2, where the additional gain compensation capacitor is shown as Cgain. This capacitor is used for input voltage sampling (i.e., it is connected to $V_{IN}$ during the sampling phase), but is not switched to any positive reference during conversion. This ensures that the sampled input voltage has the same weight as the capacitors switched to reference during charge redistribution (conversion). The capacitance of the Cgain capacitor can be calculated according to:

$$Cgain=SUM(C_{LSB})*V_{REFINT}/V_{REF},$$

where $SUM(C_{LSB})$ refers to the sum of the capacitances of the LSB capacitors and $V_{REFINT}$ and $V_{REF}$ are the internal and external reference voltages, respectively.

The split-DAC approach can be very useful in microcontroller applications where multiple ADC outputs are needed. In this application, a passive sample-and-hold ADC may be used. The passive sample-and-hold ADC exploits sharing of ADC components between different samplers, to reduce circuit area.

Figure 3:
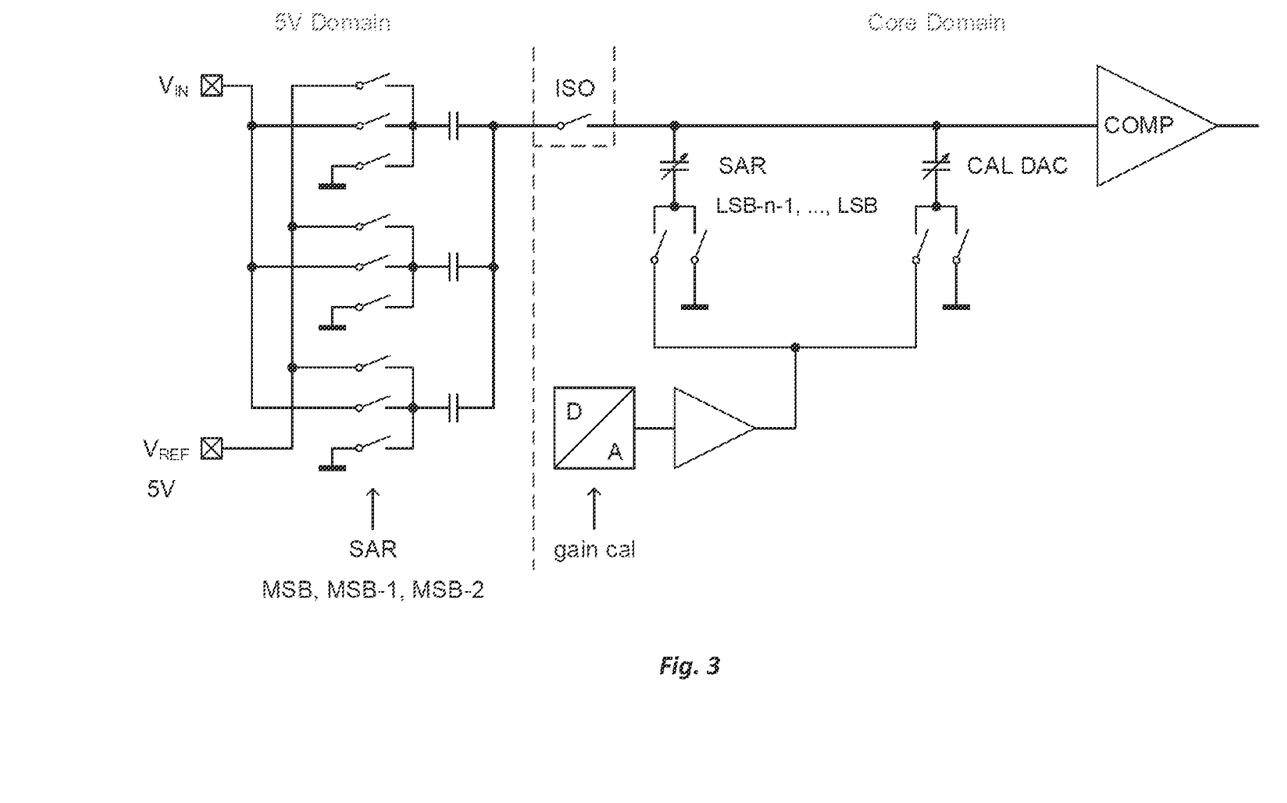
FIG. 3 illustrates an example embodiment including a passive sample-and-hold (SH) ADC.

FIG. 3 illustrates an example of a single sample-and-hold circuit plus ADC core. One potential implementation of an SH ADC is keeping the DAC in the passive sampler. This has several advantages. One particular advantage is the intrinsically perfect gain. The same caps are connected to the input voltage and, after sampling, to the reference voltage. FIG. 3 shows such an implementation.

Figure 4:
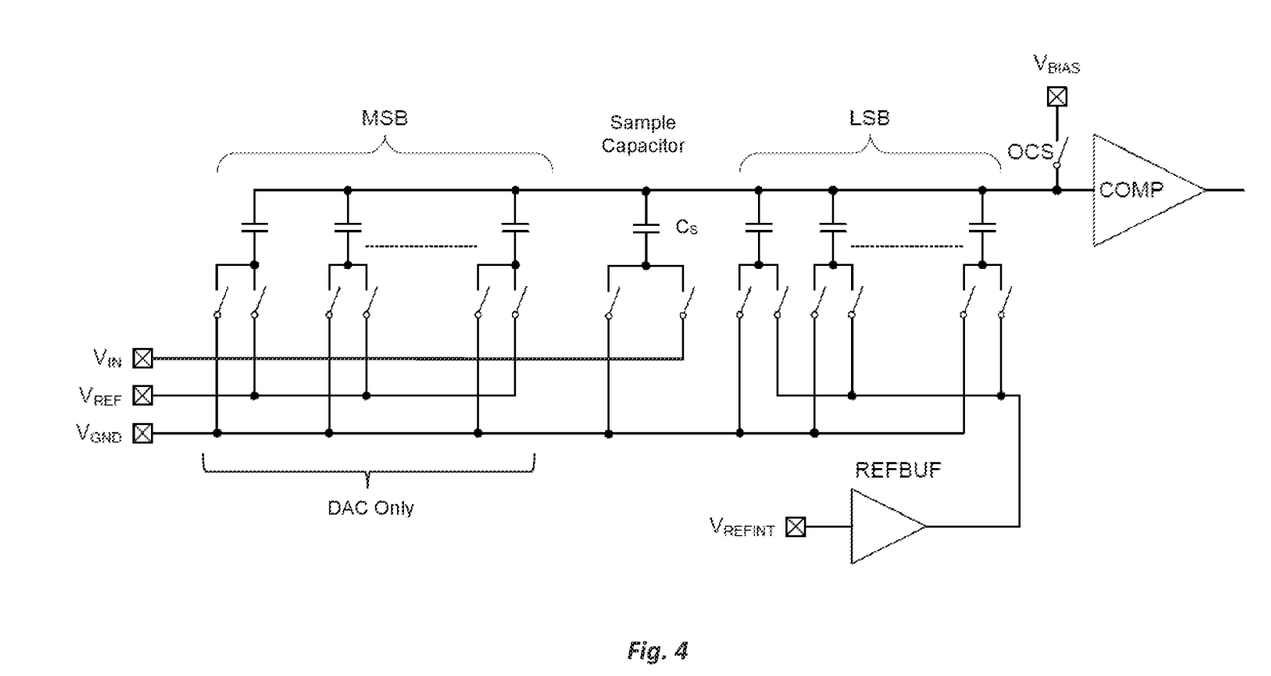
FIG. 4 is another example embodiment.

A variant approach, which is shown in FIG. 4, can have a dedicated sample capacitor and an independent shared DAC within the ADC core. In this variant, the capacitors coupled to the external reference are used during the conversion phase only; the dedicated sample capacitor CS, which has a capacitance equivalent to that of the external DAC capacitors, is used during the sampling phase. The embodiment shown in Figure could be converted to a SH ADC by adding an isolation switch, after the sample capacitor, to isolate the sampling capacitor and the rest of the circuitry during the sampling process.

An additional detail in the example circuit shown in FIG. 3 involves the generation of the internal reference. As noted above, the ratio of the internal reference voltage to the external reference voltage should be very accurately matched to the scaling of the of the binary-weighted MSB DAC capacitances, relative to the binary-weighted LSB capacitances. With an incorrect reference, missing codes can be generated. One potential method to achieve a correct voltage is via calibration. As shown in FIG. 3, a supplementary DAC can be used for calibration, with its output buffered to the switched-capacitor circuitry. Because a low-voltage reference is available, the calibration DAC can be implemented with thin-oxide transistors, like the other low-voltage circuitry, using the same reference as the LSB capacitors. While FIG. 3 shows the supplemental DAC and its output buffer as two separate features, for clarity of illustration, this DAC and buffer can be merged into a single circuit block, in some embodiments. For example, a single-bit sigma-delta with integrated buffer might be used for this portion of the circuit illustrated in FIG. 3.

An additional difference in the circuit shown in FIG. 3, compared to a normal SAR ADC, is the isolation switch ISO, which allows the sampler on the left-hand side of the illustrated circuit to be isolated from the core. This facilitates the implementation of a multiplexer on the left side of the switch, meaning that a set of passive samplers may be connected, to the ADC core, via respective isolation switches, and selectively connected to the core for conversion of the respective stored voltage samples.

Figure 5:
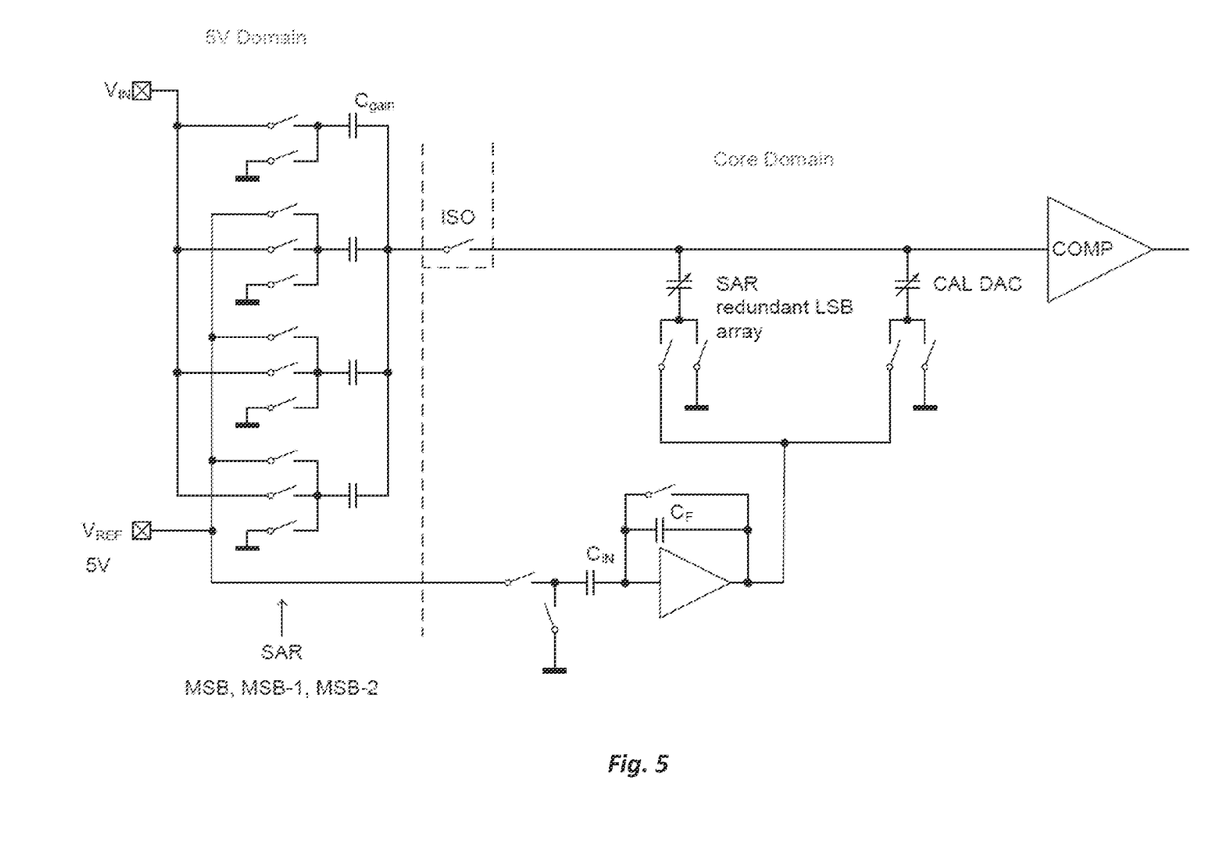
FIG. 5 illustrates a variation of the circuit shown in FIG. 3, including a redundant LSB capacitor array, gain correction, and switched-capacitor low-voltage reference generation.

The circuit shown in FIG. 3 will have a gain error for the same reason as discussed above for FIG. 1, due to the fact that different sets of the capacitors are used, respectively, for input voltage sampling and for comparison to the voltage reference. This weakness can be addressed with the same correction shown in FIG. 2, i.e., by the addition of a gain compensating capacitor. FIG. 5 illustrates an example circuit implementing the sample-and-hold concept shown in FIG. 3, in this case including a gain correction capacitor (labeled Cgain) implemented in the passive sample-and-hold circuitry. The capacitance of this capacitor can be calculated using the same formula described above, for FIG. 2.

The circuit of FIG. 5 also includes several additional modifications, compared to that of FIG. 3. In the circuit of FIG. 3, a DAC is used to generate the low-voltage reference. This job can be achieved also by using a switched-capacitor amplifier, as shown in FIG. 5. In this figure, the reference voltage is sampled on capacitor C, during a reset phase of the ADC core. During the conversion phase, the sampled reference is distributed to capacitor $C_F$, and the ratio of the capacitance of $C_{IN}$ to the capacitance of $C_F$ defines the generated reference voltage at the output of the reference buffer. With calibration, either the input capacitance or the feedback capacitance can be modified to trim the output voltage of the buffer. Alternatively, the buffer output may be used with its error, with a final compensating correction applied in ADC core calibration or in digital post-processing.

Another feature included in the circuit of FIG. 5 is a redundant coding of the LSB capacitor array. The LSB array can be extended by at least one additional capacitor to increase the search window of the LSB portion of DAC. The search window should be bigger than the residual window generated from the MSB capacitors. This is called redundant coding and is a known technique. New in the circuit of FIG. 4, however, is the implementation of the redundant coding on a different reference voltage. Errors generated from the comparator during the MSB search can be compensated by the increased search window available in the LSB DAC. The search result of the MSB register must be corrected if a wrong decision is detected by the LSB search. This can be implemented by digital post-processing of the SAR result.

Figure 6:
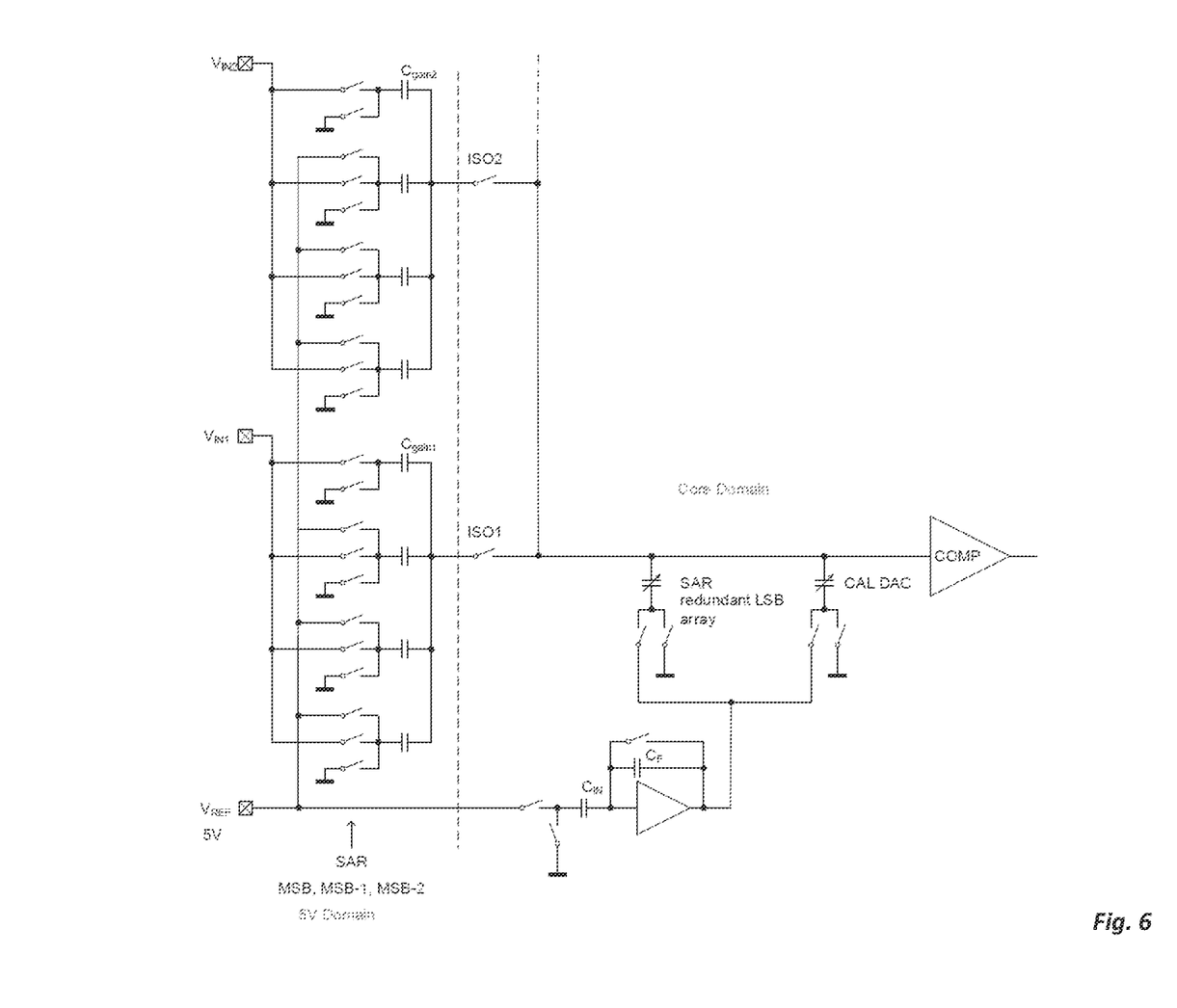
FIG. 6 illustrates an example implementation including two passive sample-and-hold circuits.

FIG. 6 illustrates an example of the extension of the circuits described above to a time-multiplexing ADC with two input channels. This circuit includes two MSB sampling DACs, isolated from the core circuit by switches ISO1 and ISO2, respectively. Further input channels can be added using additional isolation switches and MSB DACs. Note that in this and several preceding figures, some switches, such as the offset compensation switch, are omitted, for simplicity.

With the use of a split-DAC array with two different references within an ADC, as shown in the example circuits illustrated in FIGS. 1-6, a conversion speed improvement can be achieved. One reference can be a low-noise external reference, while the second reference can be a noisier internal reference. The switches implemented for the two different references can be chosen with thick-oxide transistors for the external reference and thin-oxide transistors for the internal reference. The noise figure of such a split DAC is much better than a comparable DAC implemented with a low-voltage reference using thin-oxide transistors only. Further, the different switch type and reference-driving capability associated with the internal reference allow much faster conversion steps for the LSB decisions. Use of the split DAC with two references can also reduce the needed area for the DAC. In addition, by using a redundant cap array for the LSB caps connected to the low voltage reference, wrong comparator decisions from the MSB capacitors, can be corrected. This allows even faster operation speed of the ADC.

In view of the several examples described above and illustrated in FIGS. 1-6, it will be appreciated that an example embodiment of the presently disclosed invention is a successive-approximation analog-to-digital converter (ADC) circuit that comprises a voltage comparator, e.g., as illustrated by comparator COMP in FIGS. 1-6, one or more most-significant-bit (MSB) capacitors, e.g., as shown in FIGS. 1-6, with each having a first end connected to an input of the comparator, and one or more least-significant-bit (LSB) capacitors, e.g., as shown in FIGS. 1-6, again with each having a first end connected to the input of the comparator.

This example embodiment further comprises one or more first switch devices corresponding to each MSB capacitor and configured to selectively connect the second end of the respective MSB capacitor to (a) an input voltage, for the duration of a sampling phase, (b) a ground reference, during portions of a conversion phase, and (c) a first conversion reference voltage for other portions of the conversion phase. In FIGS. 1-6, the "one or more first switch devices" for each MSB capacitor are illustrated as comprising three single-pole single-throw switches—it will be appreciated that there are numerous possible implementations of a switching circuit that enables the selective connection of an MSB connector to one of three nodes, as shown in a general manner in the figures.

The example embodiment further comprises one or more second switch devices corresponding to each LSB capacitor and configured to selectively connect the second end of the respective LSB capacitor between (d) the ground reference, during portions of the conversion phase, and (e) a second conversion reference voltage, for other portions of the conversion phase, where the second conversion reference voltage differs from the first conversion reference voltage. Again, in FIGS. 1-6, the "one or more second switch devices" for each LSB capacitor are illustrated as a pair of single-pole single-throw switches. Again, it will be appreciated that there are numerous possible implementations of such a switch. As was discussed above, because these second switch devices are exposed to only the (lower)

second conversion reference voltage, in some embodiments, they may be implemented with low-voltage transistor devices.

The fact that the first and second conversion reference voltages are different, in the embodiment described, is what makes this embodiment an example of the split-reference concept described throughout this document. For proper operation, the ratio of the first conversion reference voltage to the second conversion reference voltage should be at least substantially the same as the scaling ratio applied to the one or more binary-weighted MSB capacitors, relative to the capacitances of the one or more binary-weighted LSB capacitors. By "substantially the same" is mean that the difference in ratio, in percentage terms, should be smaller than an acceptable maximum uncorrected linearity error for the circuit, which in turn may depend on the circuit's application. Note that the acceptable maximum uncorrected linearity error, which might be 1%, 5%, or 10%, in various applications, may depend on whether the circuit implements calibration and correction of linearity errors.

The description of the example embodiment above indicated that the one or more second switch devices are configured to selectively connect the second end of each respective LSB capacitor between (d) the ground reference, during portions of the conversion phase, and (e) a second conversion reference voltage, for other portions of the conversion phase. In some implementations, some or all of these second switch devices are further configured to selectively connect the second end of the respective LSB capacitor to the ground reference during the sampling phase. In other implementations, some or all of these second switch devices are instead configured to selectively connect the second end of the respective LSB capacitor to the input voltage during the sampling phase. In this latter implementation, it will be appreciated that these switch devices are exposed to the full scale of the input voltage. Thus, the implementation of these switch devices may need to be more robust than would be necessary if these devices were instead connected to ground during the sampling phase.

In some implementations of the example successive-approximation ADC circuit, the comparator, the one or more second switch devices, and a source for the second conversion reference voltage are contained in an integrated circuit, while the one or more first switch devices and a source for the first conversion reference voltage being external to the integrated circuit. However, the concepts described herein are more generally applicable.

Some implementations may include a gain correction capacitor having a first end connected to the input of the comparator, as well as one or more third switch devices arranged to selectively connect the second end of the gain correction capacitor to the input voltage, for the duration of the sampling phase, and to the ground reference, during the conversion phase. Examples of this are shown in FIGS. 2, 5, and 6.

Some implementations may include at least one isolation switch, as shown in each of FIGS. 3-5, configured so that the first end of each MSB capacitor is connected to the input of the comparator via the at least one isolation switch. As was discussed above, this facilitates implementations where multiple sampling arrays are multiplexed, using the isolation switches, so that they can share an ADC core.

Some implementations may comprise a digital-to-analog converter (DAC) circuit configured to generate the second conversion reference voltage, responsive to a calibration input. Others might instead comprise a switched-capacitor amplifier configured to generate the second conversion reference voltage. In some of the latter implementations, an input capacitance of the switched-capacitor amplifier or a feedback capacitance of the switched-capacitor amplifier, or both, may be adjustable, so as to allow calibration and/or control of the second conversion reference voltage.

In some implementations, the one or more LSB capacitors may consist of a redundant LSB capacitor array, the capacitors of the redundant LSB capacitor array having capacitances such that a successive-approximation search window provided by the redundant LSB capacitor array is greater than a residual search window provided by the one or more MSB capacitors.

Although various implementations are described above in language specific to structural features and/or methodological acts, it is to be understood that the implementations are not necessarily limited to the specific features or acts described. Rather, the specific features and acts are disclosed as representative forms of implementing example devices and techniques. The above embodiments serve only as some examples how to implement the present invention and are therefore not to be construed as limiting the scope thereof.

The invention claimed is:

1. A successive-approximation analog-to-digital converter (ADC) circuit, comprising:
a voltage comparator;
one or more most-significant-bit (MSB) capacitors, each having a first end connected to an input of the comparator;
one or more least-significant-bit (LSB) capacitors, each having a first end connected to the input of the comparator;
one or more first switch devices corresponding to each MSB capacitor and configured to selectively connect the second end of the respective MSB capacitor to (a) an input voltage, for the duration of a sampling phase, (b) a ground reference, during portions of a conversion phase, and (c) a first conversion reference voltage for other portions of the conversion phase; and
one or more second switch devices corresponding to each LSB capacitor and configured to selectively connect the second end of the respective LSB capacitor between (d) the ground reference, during portions of the conversion phase, and (e) a second conversion reference voltage, for other portions of the conversion phase, the second conversion reference voltage differing from the first conversion reference voltage;
wherein the comparator, the one or more second switch devices, and a source for the second conversion reference voltage are contained in an integrated circuit, the source for the first conversion reference voltage being external to the integrated circuit.

2. The successive-approximation ADC circuit of claim 1, wherein the one or more second switch devices are further configured to selectively connect the second end of the respective LSB capacitor to the ground reference during the sampling phase.

3. The successive-approximation ADC circuit of claim 1, wherein the one or more second switch devices are further configured to selectively connect the second end of the respective LSB capacitor to the input voltage during the sampling phase.

4. The successive-approximation ADC circuit of claim 1, wherein the one or more first switch devices are external to the integrated circuit.

5. The successive-approximation ADC circuit of claim 1, wherein the capacitances of the MSB capacitors and the LSB capacitors follow a binary weighting pattern except that the capacitances of the MSB capacitors are each scaled, relative to the capacitances of the LSB capacitors, according to the ratio of the second conversion reference voltage to the first conversion reference voltage.

6. The successive-approximation ADC circuit of claim 1, further comprising:
a gain correction capacitor having a first end connected to the input of the comparator; and
one or more third switch devices arranged to selectively connect the second end of the gain correction capacitor to the input voltage, for the duration of the sampling phase, and to the ground reference, during the conversion phase.

7. The successive-approximation ADC circuit of claim 1, further comprising at least one isolation switch configured so that the first end of each MSB capacitor is connected to the input of the comparator via the at least one isolation switch.

8. The successive-approximation ADC circuit of claim 1, further comprising a digital-to-analog converter (DAC) circuit configured to generate the second conversion reference voltage, responsive to a calibration input.

9. The successive-approximation ADC circuit of claim 1, further comprising a switched-capacitor amplifier configured to generate the second conversion reference voltage.

10. The successive-approximation ADC circuit of claim 9, wherein an input capacitance of the switched-capacitor amplifier or a feedback capacitance of the switched-capacitor amplifier, or both, is/are adjustable, so as to control the second conversion reference voltage.

11. The successive-approximation ADC circuit of claim 1, wherein the one or more LSB capacitors consist of a redundant LSB capacitor array, the capacitors of the redundant LSB capacitor array having capacitances such that a successive-approximation search window provided by the redundant LSB capacitor array is greater than a residual search window provided by the one or more MSB capacitors.

12. A successive-approximation analog-to-digital converter (ADC) circuit, comprising:
a voltage comparator;
one or more sample capacitors, each having a first end connected to an input of the comparator;
one or more most-significant-bit (MSB) digital-to-analog converter (DAC) capacitors, each having a first end connected to an input of the comparator;
one or more least-significant-bit (LSB) DAC capacitors, each having a first end connected to the input of the comparator;
one or more first switch devices corresponding to each sample capacitor and configured to selectively connect the second end of the respective sample capacitor to (a) an input voltage, for the duration of a sampling phase, and (b) a ground reference, during portions of a conversion phase;
one or more second switch devices corresponding to each MSB capacitor and configured to selectively connect the second end of the respective MSB capacitor to (c) the ground reference, during portions of a conversion phase, and (d) a first conversion reference voltage for other portions of the conversion phase; and
one or more third switch devices corresponding to each LSB capacitor and configured to selectively connect the second end of the respective LSB capacitor between (e) the ground reference, during portions of the conversion phase, and (f) a second conversion reference voltage, for other portions of the conversion phase, the second conversion reference voltage differing from the first conversion reference voltage.

13. The successive-approximation ADC circuit of claim 12, wherein the one or more third switch devices are further configured to selectively connect the second end of the respective LSB capacitor to the ground reference during the sampling phase.

14. The successive-approximation ADC circuit of claim 12, wherein the one or more third switch devices are further configured to selectively connect the second end of the respective LSB capacitor to the input voltage during the sampling phase.

15. The successive-approximation ADC circuit of claim 12, wherein the comparator, the one or more third switch devices, and a source for the second conversion reference voltage are contained in an integrated circuit, the one or more second switch devices and a source for the first conversion reference voltage being external to the integrated circuit.

16. The successive-approximation ADC circuit of claim 12, wherein the capacitances of the MSB capacitors and the LSB capacitors follow a binary weighting pattern except that the capacitances of the MSB capacitors are each scaled, relative to the capacitances of the LSB capacitors, according to the ratio of the second conversion reference voltage to the first conversion reference voltage.

17. The successive-approximation ADC circuit of claim 12, further comprising at least one isolation switch configured so that the first end of each MSB capacitor is connected to the input of the comparator via the at least one isolation switch.

18. The successive-approximation ADC circuit of claim 12, further comprising a digital-to-analog converter (DAC) circuit configured to generate the second conversion reference voltage, responsive to a calibration input.

19. The successive-approximation ADC circuit o of claim 12, further comprising a switched-capacitor amplifier configured to generate the second conversion reference voltage.

20. The successive-approximation ADC circuit of claim 19, wherein an input capacitance of the switched-capacitor amplifier or a feedback capacitance of the switched-capacitor amplifier, or both, is/are adjustable, so as to control the second conversion reference voltage.

\* \* \* \* \*